United States Patent
Nishitsuji et al.

(10) Patent No.: US 12,015,838 B2
(45) Date of Patent: Jun. 18, 2024

(54) LIGHT SHIELDING PLATE, CAMERA UNIT, AND ELECTRONIC DEVICE

(71) Applicant: TOPPAN INC., Tokyo (JP)

(72) Inventors: Kiyoaki Nishitsuji, Tokyo (JP); Shinichi Shimamura, Tokyo (JP)

(73) Assignee: TOPPAN INC., Tokyo (JP)

( * ) Notice: Subject to any disclaimer, the term of this patent is extended or adjusted under 35 U.S.C. 154(b) by 336 days.

(21) Appl. No.: 17/574,859

(22) Filed: Jan. 13, 2022

(65) Prior Publication Data

US 2022/0137270 A1    May 5, 2022

Related U.S. Application Data

(63) Continuation of application No. PCT/JP2020/027893, filed on Jul. 17, 2020.

(30) Foreign Application Priority Data

Jul. 19, 2019  (JP) .................................. 2019-134036
Jul. 19, 2019  (JP) .................................. 2019-134037

(Continued)

(51) Int. Cl.
*H04N 23/55*   (2023.01)
*C23C 16/30*   (2006.01)
(Continued)

(52) U.S. Cl.
CPC ............. *H04N 23/55* (2023.01); *C23C 16/30* (2013.01); *C23F 1/02* (2013.01); *G02B 1/113* (2013.01);
(Continued)

(58) Field of Classification Search
CPC ........ H04N 23/50; H04N 23/51; H04N 23/55; G02B 5/005; G03B 9/02; H01L 27/14623
(Continued)

(56) References Cited

U.S. PATENT DOCUMENTS

2006/0051085 A1    3/2006  Okumura
2011/0109970 A1    5/2011  Abe et al.
(Continued)

FOREIGN PATENT DOCUMENTS

CN    101546132 A    9/2009
JP    2002-229095 A    8/2002
(Continued)

OTHER PUBLICATIONS

International Searching Authority, "International Search Report," issued in connection with International Patent Application No. PCT/JP2020/027893, dated Oct. 6, 2020, 5 pages.
(Continued)

*Primary Examiner* — Anthony J Daniels

(74) *Attorney, Agent, or Firm* — Foley & Lardner LLP

(57) ABSTRACT

A light shielding plate including a front surface located on a light incident side, a rear surface facing away from the front surface, and an aperture penetrating through the front and rear surfaces. The aperture includes a first aperture portion and a second aperture portion connected to the first aperture portion via a central opening. The first aperture portion extends from a rear opening in the rear surface toward the central opening and has a shape tapered from the rear surface toward the front surface. The second aperture portion extends from a front opening in the front surface toward the central opening and has a shape tapered from the front surface toward the rear surface. The front opening is larger than the rear opening.

11 Claims, 5 Drawing Sheets

(30) Foreign Application Priority Data

| | | | |
|---|---|---|---|
| Jul. 19, 2019 | (JP) | ................................ | 2019-134038 |
| Sep. 13, 2019 | (JP) | ................................ | 2019-167431 |
| Sep. 13, 2019 | (JP) | ................................ | 2019-167432 |
| Sep. 13, 2019 | (JP) | ................................ | 2019-167433 |

(51) Int. Cl.
| | |
|---|---|
| *C23F 1/02* | (2006.01) |
| *G02B 1/113* | (2015.01) |
| *G02B 5/00* | (2006.01) |
| *H04N 23/50* | (2023.01) |
| *H04N 23/51* | (2023.01) |

(52) U.S. Cl.
CPC ............ *G02B 5/005* (2013.01); *H04N 23/50* (2023.01); *H04N 23/51* (2023.01)

(58) Field of Classification Search
USPC ......................................................... 348/374
See application file for complete search history.

(56) References Cited

U.S. PATENT DOCUMENTS

| | | | | |
|---|---|---|---|---|
| 2013/0021683 A1* | 1/2013 | Yu | ........................... | G02B 7/021 |
| | | | | 359/819 |
| 2013/0037695 A1 | 2/2013 | Lee | | |
| 2019/0324267 A1 | 10/2019 | Chang et al. | | |
| 2022/0137270 A1 | 5/2022 | Nishitsuji et al. | | |
| 2022/0141361 A1 | 5/2022 | Nishitsuji et al. | | |
| 2022/0141362 A1 | 5/2022 | Nishitsuji et al. | | |

FOREIGN PATENT DOCUMENTS

| | | | | |
|---|---|---|---|---|
| JP | 2006-072151 A | | 3/2006 | |
| JP | 2008-257134 A | | 10/2008 | |
| JP | 2010-008786 A | | 1/2010 | |
| JP | 2015099262 A | * | 5/2015 | ......... G02B 27/0018 |
| JP | 2021-018402 A | | 2/2021 | |
| TW | 200949298 A | | 12/2009 | |
| WO | WO 2016/060198 A1 | | 4/2016 | |

OTHER PUBLICATIONS

International Searching Authority, "Written Opinion," issued in connection with International Patent Application No. PCT/JP2020/027896, dated Oct. 6, 2020, 3 pages.

Office Action issued in related Chinese Patent Application No. 202080050763.0, dated Apr. 7, 2023.

International Searching Authority, "International Search Report," issued in connection with International Patent Application No. PCT/JP2020/027892, dated Oct. 6, 2020, 5 pages.

International Searching Authority, "Written Opinion," issued in connection with International Patent Application No. PCT/JP2020/027892, dated Oct. 6, 2020, 4 pages.

Office Action issued in corresponding Taiwanese Patent Application No. 109124325 dated Jun. 25, 2021.

Japanese Office Action issued in connection with JP Appl. Ser. No. 2022-176991 dated May 30, 2023.

* cited by examiner

LIGHT SHIELDING PLATE, CAMERA UNIT, AND ELECTRONIC DEVICE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/027893, filed on Jul. 17, 2020, which is based upon and claims the benefit of priority to Japanese Patent Application No. 2019-134036, filed on Jul. 19, 2019; Japanese Patent Application No. 2019-134037, filed on Jul. 19, 2019; Japanese Patent Application No. 2019-134038, filed on Jul. 19, 2019; Japanese Patent Application No. 2019-167431, filed on Sep. 13, 2019; Japanese Patent Application No. 2019-167432, filed on Sep. 13, 2019; Japanese Patent Application No. 2019-167433, filed on Sep. 13, 2019; the disclosures of which are incorporated herein by reference in their entireties.

TECHNICAL FIELD

The present invention relates to light shielding plates, camera units including light shielding plates, and electronic devices including camera units.

BACKGROUND

Camera units provided to electronic devices, such as smartphones, include light shielding plates that serve as diaphragms for external light. Resin light shielding plates are widely used because they can be easily molded into a predetermined shape (e.g., see PTL 1). However, since resin light shielding plates are optically transparent, they allow external light to pass not only through their apertures for passing external light but also through parts defining the apertures. Thus, resin light shielding plates cannot sufficiently shield against light and for this reason metal light shielding plates having higher light shielding properties are beginning to be used (e.g., see PTL 2).

[Citation List] [Patent Literature] [PTL 1] JP 2010-8786 A; [PTL 2] WO2016/060198.

SUMMARY OF THE INVENTION

Technical Problem

When producing metal light shielding plates, punching, that is, processing in which metal plates are punched with dies, is used because this processing is not difficult technically and can produce many products per unit time. When processing a metal plate using punching, the metal plate is required to be punched in the direction perpendicular to the surface thereof to reduce the occurrence of deformation or strain in the metal plate when it is punched by the die and to thereby secure dimensional accuracy of the product. Thus, in a cross section perpendicular to the surface of the metal plate, the metal plate is provided with an aperture having a side surface extending perpendicularly to the surface of the metal plate.

If a light shielding plate having such an aperture is installed in a camera unit, external light that is incident on the light shielding plate in a direction forming an acute angle with the surface of the light shielding plate may be reflected by the side surface defining the aperture and may resultantly pass through the aperture. The light that has passed through the aperture is received by an imaging part provided to the camera unit and may cause ghosting and/or flare in the image captured by the imaging part. In this way, metal light shielding plates suffer from new issues due to the light shielding plates being made of metal.

The present invention aims to provide a light shielding plate capable of reducing the amount of light reflected by the side surface that defines the aperture for light to pass therethrough, and to provide a camera unit and an electronic device.

Solution to Problem

A light shielding plate for solving the above issues is a light shielding plate made of metal and including a front surface located on a light incident side, a rear surface facing away from the front surface, and an aperture penetrating through the front surface and the rear surface. The aperture includes a first aperture portion and a second aperture portion connected to the first aperture portion via a central opening, the first aperture portion extending from a rear opening in the rear surface toward the central opening and having a shape tapered from the rear surface toward the front surface, the second aperture portion extending from a front opening in the front surface toward the central opening and having a shape tapered from the front surface toward the rear surface, the front opening being larger than the rear opening. When an image of an edge of the central opening is captured in a radial direction thereof by bringing the edge into focus under imaging conditions where a depth of field is 0.4 μm, a maximum focusable length of the light shielding plate that can be in focus in a thickness direction thereof is 7.0 μm or less.

A camera unit for solving the above issues includes the above light shielding plate.

An electronic device for solving the above issues includes the above camera unit.

With the above configurations, if the maximum focusable length that can be in focus is 7.0 μm or less, the area of the side surface defining the aperture can be reduced in the vicinity of the central opening, and the amount of light reflected by the side surface defining the aperture can be reduced in the vicinity of the central opening. Consequently, the amount of light reflected by the side surface that defines the aperture for light to pass therethrough can be reduced.

A light shielding plate for solving the above issues is a light shielding plate made of metal and including a front surface located on a light incident side, a rear surface facing away from the front surface, and an aperture penetrating through the front surface and the rear surface. The aperture includes a first aperture portion and a second aperture portion connected to the first aperture portion via a central opening, the first aperture portion extending from a rear opening in the rear surface toward the central opening and having a shape tapered from the rear surface toward the front surface, the second aperture portion extending from a front opening in the front surface toward the central opening and having a shape tapered from the front surface toward the rear surface, the front opening being larger than the rear opening. When an image of an edge of the central opening is captured in a radial direction thereof by bringing the edge into focus under imaging conditions where a depth of field is 0.4 μm, a maximum focusable length of the light shielding plate that can be in focus in a thickness direction thereof is 30% or less the thickness of the light shielding plate in the thickness direction thereof.

With the above configuration, if the maximum focusable length that can be in focus is 30% or less the thickness of the light shielding plate in the thickness direction thereof, the area of the side surface defining the aperture can be reduced in the vicinity of the central opening, and the amount of light reflected by the side surface defining the aperture can be reduced in the vicinity of the central opening. Consequently, the amount of light reflected by the side surface that defines the aperture for light to pass therethrough can be reduced.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

First Embodiment

Referring to FIGS. 1 to 9, a first embodiment for a light shielding plate, a camera unit, and an electronic device will be described. The following description is sequentially given of a light shielding plate, a method of producing the light shielding plate, and examples.

[Light Shielding Plate]

Referring to FIGS. 1 to 5, a light shielding plate will be described.

Figure 1:
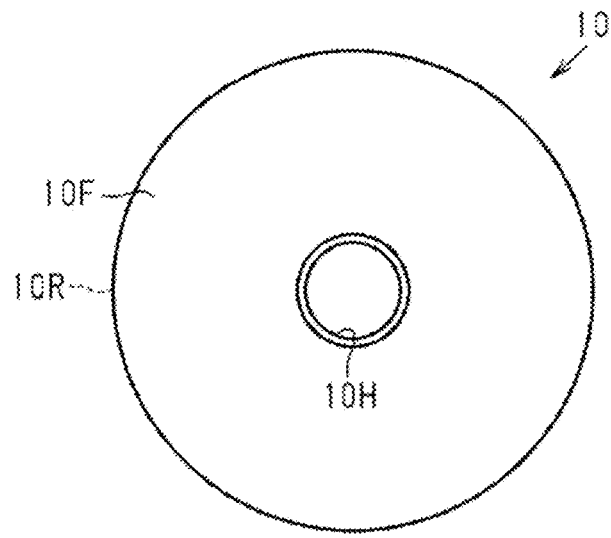
FIG. 1 is a plan view illustrating a structure of a light shielding plate according to a first embodiment.

FIG. 1 shows a light shielding plate 10 made of metal including a front surface 10F, a rear surface 10R and an aperture 10H. The front surface 10F is a surface located on a light incident side. The rear surface 10R is a surface facing away from the front surface 10F. The aperture 10H penetrates through the front surface 10F and the rear surface 10R. The light shielding plate 10 may be made of stainless steel, for example, or may be made of metals other than stainless steel. It should be noted that, in the light shielding plate 10, the front surface 10F, the rear surface 10R, and a side surface defining the aperture 10H are covered with an antireflective film, not shown. The antireflective film has a reflectance lower than that of the metal forming the light shielding plate 10, and absorbs part of the light applied to the antireflective film. It should be noted that, even if the light shielding plate 10 is covered with the antireflective film, reflection of light at the light shielding plate 10 cannot be completely eliminated.

The light shielding plate 10 has a circular shape according to the shape of the lens that the light shielding plate 10 covers. The aperture 10H has a circular shape according to the shape of the lens the aperture 10H faces.

Figure 2:
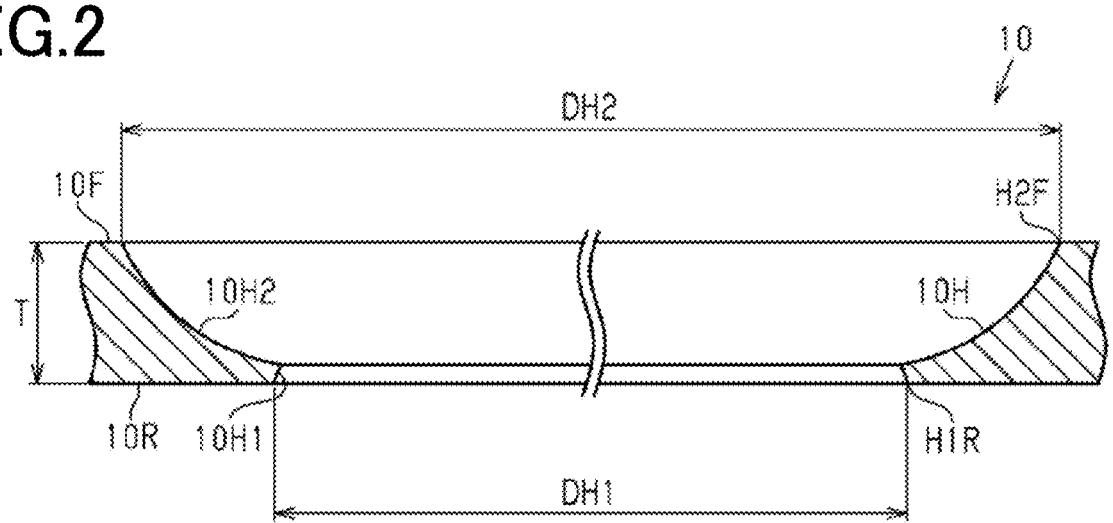
FIG. 2 is a cross-sectional view illustrating the structure of the light shielding plate shown in FIG. 1.

FIG. 2 shows a structure of the light shielding plate 10 in a cross section perpendicular to the front surface 10F of the light shielding plate 10.

As shown in FIG. 2, the aperture 10H includes a first aperture portion 10H1 and a second aperture portion 10H2. The first aperture portion 10H1 extends from a rear opening H1R in the rear surface 10R to a central opening HC (see FIG. 3). The first aperture portion 10H1 has a shape tapered from the rear surface 10R toward the front surface 10F. The second aperture portion 10H2 extends from a front opening H2F in the front surface 10F to the central opening HC. The second aperture portion 10H2 has a shape tapered from the front surface 10F toward the rear surface 10R. The front opening H2F is larger than the rear opening H1R. The second aperture portion 10H2 is connected to the first aperture portion 10H1 via the central opening HC. In other words, the central opening HC is located between the front surface 10F and the rear surface 10R in the thickness direction of the light shielding plate 10.

In the present embodiment, in a cross section that is parallel to a plane perpendicular to the front surface 10F, the side surface defining the second aperture portion 10H2 has an arc shape, with the center of curvature of this portion of the side surface located outside the light shielding plate 10. Also, in a cross section that is parallel to a plane perpendicular to the front surface 10F, the side surface defining the first aperture portion 10H1 has an arc shape, with the center of curvature of this portion of the side surface located outside the light shielding plate 10.

In the light shielding plate 10, the diameter of the first aperture portion 10H1 is a first diameter DH1, and the diameter of the second aperture portion 10H2 is a second diameter DH2. The first diameter DH1 is determined according to the camera unit in which the light shielding plate 10 is installed. If the light shielding plate 10 is installed in a camera unit of a smartphone, for example, the first diameter DH1 may be 0.4 mm or more and 1.0 mm or less. If the light shielding plate 10 is installed in an in-vehicle camera, for example, the first diameter DH1 may be 2.0 mm or more and 7.0 mm or less.

The percentage of the first diameter DH1 to the second diameter DH2 (DH1/DH2×100) may be, for example, 80% or more and 99% or less. If the light shielding plate 10 is installed in a camera unit which is mounted to the front surface of a smartphone, tablet type personal computer, or notebook type personal computer, the camera unit may often capture an image of a target at a short distance. Therefore, the light shielding plate 10 does not require a large inner diameter for the lens to focus the imaging target, although the angle of view may become large. Since the space for arranging such camera units is limited, it is difficult to increase the outer diameter of the light shielding plate 10. Therefore, the percentage of the first diameter DH1 to the second diameter DH2 may be 80% or more and 90% or less.

In contrast, if the light shielding plate 10 is installed in an in-vehicle camera, the in-vehicle camera may often capture an image of a target at a medium to long distance. Therefore, since there are fewer constraints on the space where such camera units are arranged, the diameter of the lens provided to the camera units becomes large, although the angle of view may become small. Thus, to collect a wide angular range of light to the lens, the ratio of the first diameter DH1 to the second diameter DH2 in the light shielding plate 10 may be 90% or more and 99% or less.

Furthermore, if the light shielding plate 10 is installed in a camera unit that is mounted to the rear surface of a smartphone, the camera unit may often capture an image of a target at a short to long distance. Therefore, to cope with the case where the angle of view is increased, the ratio of the first diameter DH1 to the second diameter DH2 may be 80% or more and 90% or less, and to cope with the case where the angle of view is decreased, the ratio of the first diameter DH1 to the second diameter DH2 may be 90% or more and 99% or less.

The light shielding plate 10 may have a thickness T of, for example, 10 μm or more and 100 μm or less. If the thickness T of the light shielding plate 10 is 10 μm or more, the shape of the light shielding plate 10 may be prevented from being affected by warpage of the metal foil for forming the light shielding plate 10. If the thickness T of the light shielding plate 10 is 100 μm or less, the accuracy of etching when forming the aperture 10H may be prevented from being lowered.

Figure 3:
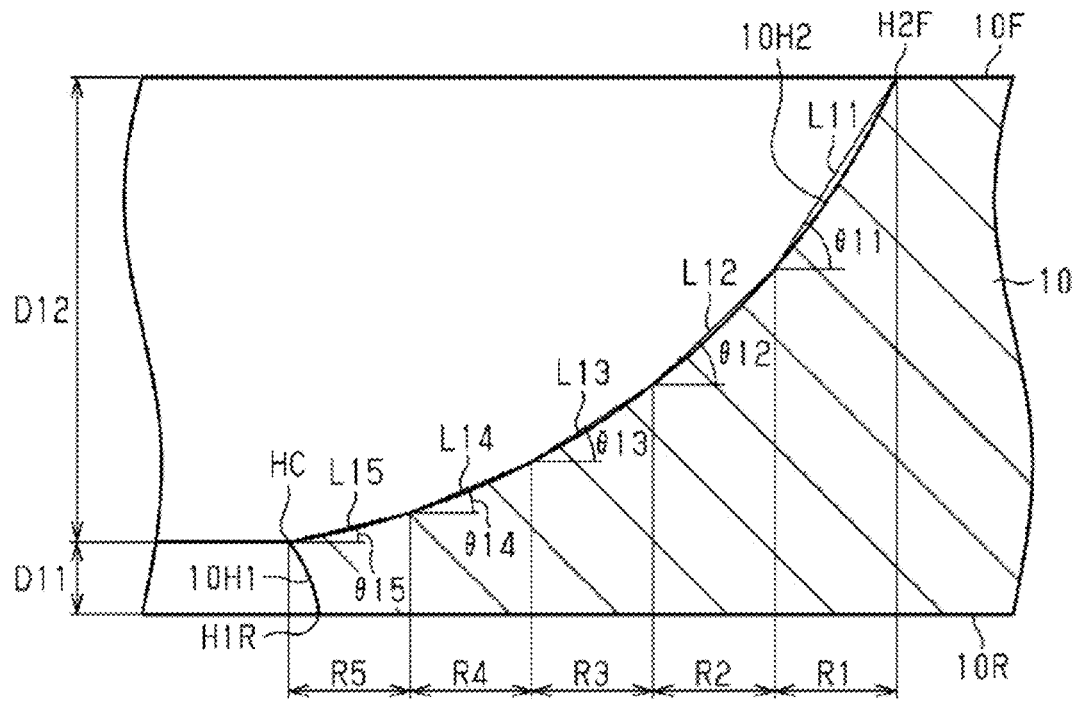
FIG. 3 is a partial enlarged cross-sectional view illustrating a part of the cross-sectional view shown in FIG. 2.

FIG. 3 shows, in an enlarged manner, the cross-sectional structure of the light shielding plate 10 shown in FIG. 2.

As shown in FIG. 3, the rear surface 10R of the light shielding plate 10 defines the rear opening H1R, and the first aperture portion 10H1 is connected to the second aperture portion 10H2 via the central opening HC. In the thickness direction of the light shielding plate 10, the distance between the rear surface 10R and the edge of the central opening HC is a first length D11. In the thickness direction of the light shielding plate 10, the distance between the front surface 10F and the edge of the central opening HC is a second length D12. In the light shielding plate 10, the ratio of the second length D12 to the first length D11 (D12/D11) is 2.5 or more.

As the ratio of the second length D12 to the first length D11 (D12/D11) increases, the central opening HC becomes relatively closer to the rear opening H1R. Thus, the area of the side surface defining the first aperture portion 10H1 can be reduced. Therefore, part of the light entering the aperture 10H from obliquely above the light shielding plate 10 and reflected by the surface of the lens is prevented from being incident on the first aperture portion 10H1 and from being reflected from the first aperture portion 10H1 toward the lens LN (see FIG. 4).

It should be noted that the ratio of the second length D12 to the first length D11 (D12/D11) is preferred to approach infinity. However, practically, an etchant may permeate into the gap between the metal foil for forming the light shielding plate 10 and the mask formed on the metal foil in the process of etching for forming the aperture 10H, and this may form a first aperture portion 10H1 having a submicron depth, i.e., the first length D11. Therefore, for example, if the metal foil has a thickness of 100 the lower limit of the first length D11 may be about 0.1 Accordingly, the upper limit of the ratio of the second length D12 to the first length D11 (D12/D11) may be about 1,000.

As viewed perpendicularly to the front surface 10F, the front opening H2F has a circular shape. As viewed perpendicularly to the front surface 10F, the side surface defining the second aperture portion 10H2 is equally divided into five regions in the radial direction of the front opening H2F, with each region being concentric with the front opening H2F. In this case, as viewed perpendicularly to the front surface 10F, the side surface defining the second aperture portion 10H2 has a first region R1, second region R2, third region R3, fourth region R4 and fifth region R5 in a direction from the edge of the front opening H2F toward the edge of the central opening HC. It should be noted that, in the side surface defining the second aperture portion 10H2, the first region R1 is a region including the edge of the front opening H2F. In the side surface defining the second aperture portion 10H2, the fifth region R5 is a region including the edge of the central opening HC.

In a cross section that is parallel to a plane perpendicular to the front surface 10F, i.e., in a cross section that is parallel to a plane passing through the center of the front opening H2F, the inclination of the line, i.e., the inclination of the line segment, connecting between one end and the other end of a part of the side surface defining the second aperture portion 10H2, relative to the front surface 10F is an inclination angle of the region in the part of the side surface. In the first region R1, the angle between a first line L11 and the front surface 10F is a first inclination angle θ11. In the second region R2, the angle between a second line L12 and the front surface 10F is a second inclination angle θ12. In the third region R3, the angle between a third line L13 and the front surface 10F is a third inclination angle θ13. In the fourth region R4, the angle between a fourth line L14 and the front surface 10F is a fourth inclination angle θ14. In the fifth region R5, the angle between a fifth line L15 and the front surface 10F is a fifth inclination angle θ15.

In a cross section that is parallel to a plane perpendicular to the front surface 10F, the first inclination angle θ11 of the first region R1 in the side surface defining the second aperture portion 10H2 is larger than the inclination angles of other regions. In other words, the first inclination θ11 of the first region R1 is the largest of the five regions. The first inclination angle θ11 is larger than any of the second, third, fourth and fifth inclination angles θ12, θ13, θ14 and θ15. The first inclination angle θ11 is 50° or more and 60° or less.

In a cross section that is parallel to a plane perpendicular to the front surface 10F, the fifth inclination angle θ15 of the fifth region R5 in the side surface defining the second aperture portion 10H2 is larger than the fourth inclination angle θ14. The inclination angles of the regions in the parts of the side surface defining the second aperture portion 10H2 become smaller from the first region R1 toward the fourth region R4. In other words, the inclination angles become smaller in order of the first, second, third and fourth inclination angles θ11, θ12, θ13 and θ14 in the side surface defining the second aperture portion 10H2.

Figure 4:
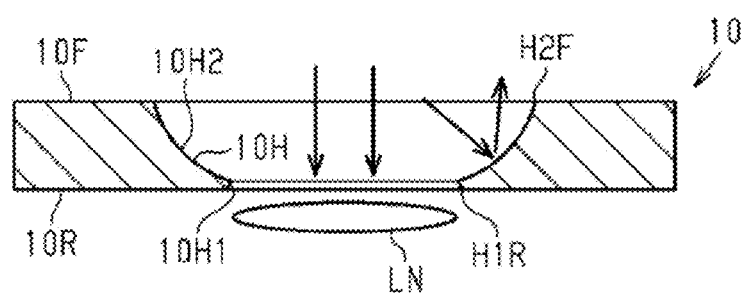
FIG. 4 is an operation diagram illustrating operation of the light shielding plate according to the first embodiment.
Figure 5:
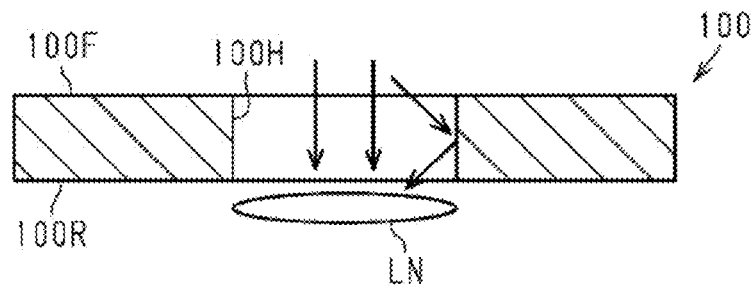
FIG. 5 is an operation diagram illustrating operation of the light shielding plate according to the first embodiment.

FIG. 4 shows a cross-sectional structure of the light shielding plate 10 according to the present embodiment. On the other hand, FIG. 5 shows a cross-sectional structure of an example as viewed from the plane perpendicular to the front surface, in which the side surface defining the aperture extends in the direction perpendicular to the front surface. It should be noted that, in FIGS. 4 and 5, the first diameter is made smaller relative to the thickness of the light shielding plate, for convenience of illustration.

As shown in FIG. 4, the light incident on the light shielding plate 10 in the direction perpendicular to the front surface 10F enters the aperture 10H from the front opening H2F formed in the front surface 10F. The light that has passed through the aperture 10H is outputted from the rear opening H1R formed in the rear surface 10R and reaches the lens LN. In the light shielding plate 10, since the second aperture portion 10H2 has a shape that is tapered from the front surface 10F toward the rear surface 10R, the light entering the aperture 10H from obliquely above the front surface 10F is likely to be reflected by the side surface defining the second aperture portion 10H2 toward the front surface 10F of the light shielding plate 10.

In addition, since the ratio of the second length D12 between the front surface 10F and the central opening HC to the first length D11 between the rear surface 10R and the central opening HC (D12/D11) is 2.5 or more, the size of the second aperture portion 10H2 can be maintained so that the shape thereof can be tapered from the front surface 10F toward the rear surface 10R. Thus, the amount of light reflected by the side surface that defines the aperture 10H for light to pass therethrough can be reduced. Consequently, unwanted light is prevented from being incident on the lens LN facing the light shielding plate 10.

In the present embodiment, the first inclination angle θ11 of the first region R1 is larger than those of the second to fifth regions R2 to R5. Therefore, light can be more easily reflected by these regions other than the first region R1 toward the front surface 10F of the light shielding plate 10, while the diameter of the second aperture portion 10H2 is prevented from becoming excessively large. Since the first inclination angle θ11 is 50° or more and 60° or less, reliability can be enhanced more in reflecting light in the first region R1 including the front opening H2F toward the front surface 10F of the light shielding plate 10, in the side surface defining the second aperture portion 10H2.

In the present embodiment, the fifth inclination angle θ15 of the fifth region R5 is larger than the fourth inclination angle θ14 of the fourth region R4. Accordingly, the diameter of the second aperture portion 10H2 can be prevented from being increased compared to the case where the fifth inclination angle θ15 of the fifth region R5 is smaller than the fourth inclination angle θ14 of the fourth region R4. Furthermore, the inclination angles decrease from the first region R1 toward the fourth region R4. Accordingly, light that is incident on the second aperture portion 10H2 can be more easily reflected therefrom as the central opening HC becomes closer toward the front surface 10F of the light shielding plate 10, compared to the case where the inclination of the side surface defining the second aperture portion 10H2 is constant across the first to fourth regions R1 to R4.

Also, light that is incident on the second aperture portion 10H2 from obliquely above the front surface 10F is reflected by the side surface having an arc shape with the center of curvature located outside the light shielding plate 10. Accordingly, specular light having the highest brightness in the reflected light is reflected from the arc-shaped side surface in a direction toward the front surface 10F of the light shielding plate 10. Therefore, the amount of light reflected by the side surface that defines the aperture 10H for light to pass therethrough can be further reduced.

In the light shielding plate 10, the side surface defining the first aperture portion 10H1 has an arc shape with the center of curvature located outside the light shielding plate 10. Therefore, compared to the case where the side surface defining the first aperture portion 10H1 has a linear profile, the amount of light reflected by the side surface defining the aperture 10H can be reduced in the vicinity of the rear opening H1R, of the light entering the aperture from obliquely above the front surface 10F. Thus, the amount of light reflected by the side surface that defines the aperture 10H for light to pass therethrough can be further reduced.

As shown in FIG. 5, the light incident on a light shielding plate 100 in the direction perpendicular to a front surface 100F enters an aperture 100H from an opening formed in the front surface 100F, similarly to the light incident on the light shielding plate 10 in the direction perpendicular to the front surface 10F. The light that has passed through the aperture 100H is outputted from the opening formed in a rear surface 100R and reaches the lens LN. In contrast, part of the light incident on the front surface 100F from obliquely above the front surface 100F enters the aperture 100H from the opening formed in the front surface 100F and is reflected by the side surface defining the aperture 100H. Since almost all the light incident on the side surface is reflected in the specular direction, the light incident on the side surface is reflected thereon toward the lens LN. Thus, unwanted light is unavoidably incident on the imaging part through the lens LN.

One or more light shielding plates 10 described above are provided to the above camera unit. Camera units including the light shielding plates 10 are installed in various types of electronic devices. Electronic devices including camera units may be, for example, smartphones, tablet type personal computers, and notebook type personal computers.

[Method of Producing Light Shielding Plate]

Referring to FIGS. 6 to 9, a method of producing the light shielding plate 10 will be described. FIGS. 6 to 9 each show a cross-sectional structure of a metal foil in a specific step in the process of producing the light shielding plate 10. In FIGS. 6 to 9, for convenience of illustration, the ratio of the second diameter DH2 to the thickness of the metal foil is reduced compared to that in the actual light shielding plate, and the ratio of the first diameter DH1 to the thickness of the metal foil is reduced compared to that in the actual light shielding plate. Also, in FIGS. 6 to 9, for convenience of illustration, the ratio of the first diameter DH1 to the second diameter DH2 is reduced compared to that in the actual light shielding plate. In addition, for convenience of illustration, FIGS. 6 to 9 only show the steps related to the formation of the aperture 10H of the light shielding plate 10 among the steps of producing the light shielding plate 10.

Figure 6:
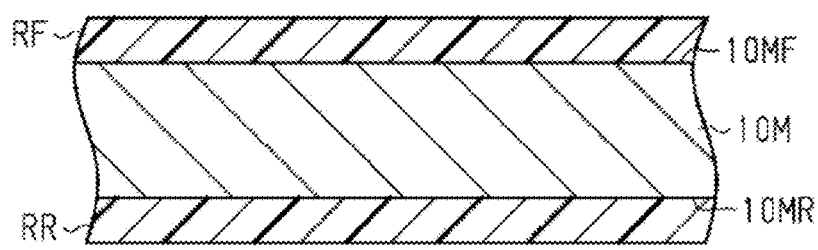
FIG. 6 is a process diagram illustrating a method of producing the light shielding plate according to the first embodiment.

As shown in FIG. 6, when forming the light shielding plate 10, a metal foil 10M for forming the light shielding plate 10 is used. The metal foil 10M may be, for example, a stainless steel foil, but may be a metal foil made of other metal than stainless steel as mentioned above. The metal foil 10M may have a thickness of 10 μm or more and 100 μm or less. If the thickness of the metal foil 10M is 10 μm or more, the shape of the light shielding plate 10 may be prevented from being affected by warpage of the metal foil 10M. If the thickness of the metal foil 10M is 100 μm or less, the accuracy of etching when forming the aperture 10H may be prevented from being lowered. The thickness of the metal foil 10M is substantially the same as that of the light shielding plate 10 made from the metal foil 10M.

Resist layers are disposed on a front surface 10MF and a rear surface 10MR of the metal foil 10M. The front surface 10MF of the metal foil 10M corresponds to the front surface 10F of the light shielding plate 10, and the rear surface 10MR of the metal foil 10M corresponds to the rear surface 10R of the light shielding plate 10. The front surface 10MF of the metal foil 10M is provided with a front resist layer RF, and the rear surface 10MR of the metal foil 10M is provided with a rear resist layer RR. It should be noted that a dry film resist may be adhered to both of the front and rear surfaces 10MF and 10MR as the resist layers RF and RR. Alternatively, a coating liquid for forming resist layers RF and RR may be applied to both of the front and rear surfaces 10MF and 10MR to form the resist layers RF and RR. The resist layers RF and RR may be formed using a negative resist or a positive resist.

Figure 7:
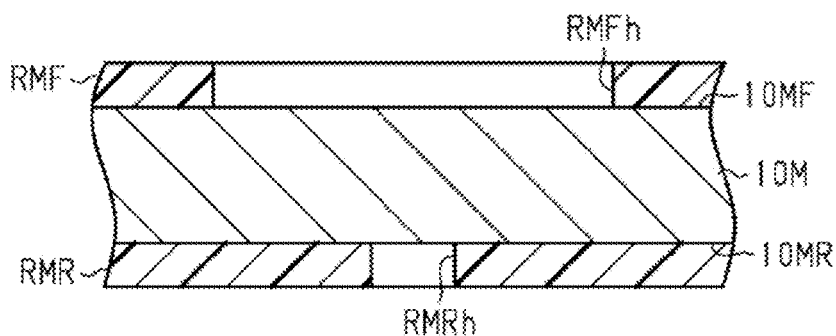
FIG. 7 is a process diagram illustrating the method of producing the light shielding plate according to the first embodiment.

As shown in FIG. 7, the resist layers RF and RR are exposed and developed to form masks from them. More specifically, the front resist layer RF is exposed and developed to form a front mask RMF from it. Also, the rear surface resist layer RR is exposed and developed to form a rear mask RMR from it. The front mask RMF has a mask hole RMFh for forming a second aperture portion in the metal foil 10M. The rear mask RMR has a mask hole RMRh for forming a first aperture portion in the metal foil 10M.

Figure 8:
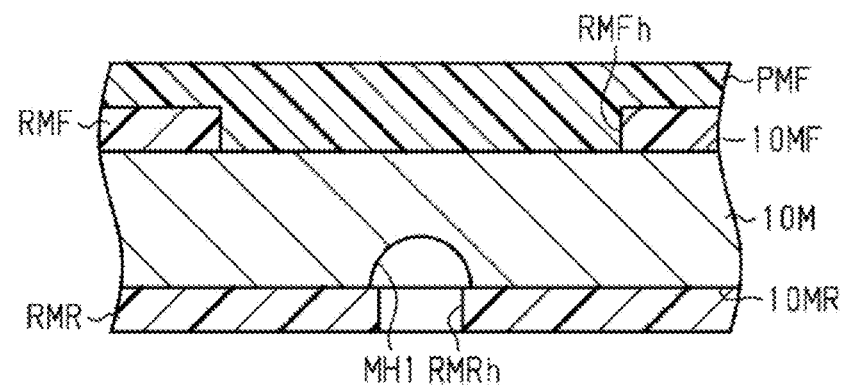
FIG. 8 is a process diagram illustrating the method of producing the light shielding plate according to the first embodiment.

As shown in FIG. 8, using the rear mask RMR formed on the rear surface 10MR, a first aperture portion MH1 having a rear opening in the rear surface 10MR and tapered from the rear surface 10MR toward the front surface 10MF is formed in the metal foil 10M. The first aperture portion MH1 corresponds to the first aperture portion 10H1 of the light shielding plate 10. In this case, the metal foil 10M is etched using an etchant capable of etching the metal foil 10M. Prior to etching the metal foil 10M, the front mask RMF is covered with an etchant resistant front protective film PMF. The front protective film PMF may fill or cover the mask hole RMFh of the front mask RMF. By covering the front mask RMF with the front protective film PMF, the front surface 10MF of the metal foil 10M is prevented from being etched simultaneously with the rear surface 10MR of the metal foil 10M.

If the first aperture portion MH1 is formed by etching of the rear surface 10MR, the first aperture portion MH1 as formed will have a depth larger than the distance between the rear surface 10R and the central opening HC of the light shielding plate 10 described above.

Figure 9:
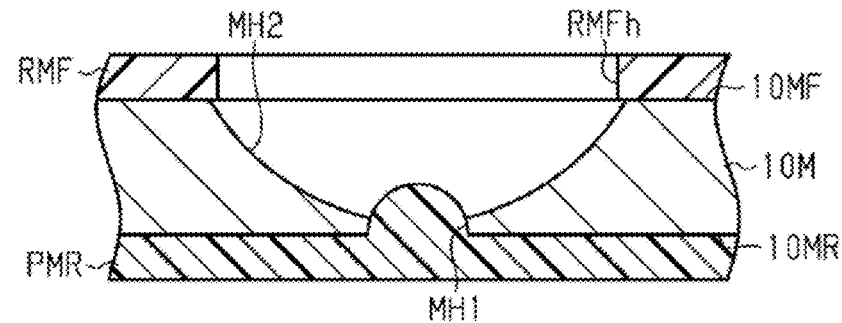
FIG. 9 is a process diagram illustrating the method of producing the light shielding plate according to the first embodiment.

As shown in FIG. 9, after forming the first aperture portion MH1, using the front mask RMF formed on the front surface 10MF, a second aperture portion MH2 having a front opening in the front surface 10MF and tapered from the front surface 10MF toward the rear surface 10MR is formed in the metal foil 10M so as to be connected to the first aperture portion MH1. The second aperture portion MH2 corresponds to the second aperture portion 10H2 of the light shielding plate 10. In this case, as in the formation of the first aperture portion MH1, the metal foil 10M is etched using an etchant capable of etching the metal foil 10M. It should be noted that the rear mask RMR is removed from the rear surface 10MR of the metal foil 10M prior to etching the metal foil 10M.

Furthermore, prior to etching the metal foil 10M, the rear surface 10MR of the metal foil 10M is covered with an etchant resistant rear protective film PMR and the first aperture portion MH1 is filled with it. By covering the rear surface 10MR of the metal foil 10M with the rear protective film PMR, the rear surface 10MR of the metal foil 10M is prevented from being etched simultaneously with the front surface 10MF of the metal foil 10M.

To obtain the second aperture portion MH2 by etching, the front surface 10MF of the metal foil 10M is etched in a state in which the first aperture portion MH1 is filled with the rear protective film PMR. Therefore, after the etching of the front surface 10MF has reached the rear protective film PMR, supply of the etchant to the metal foil 10M is limited by the rear protective film PMR. Thus, if the thickness of the metal foil 10M is in a wide range of 10 μm or more and 100 μm or less, accuracy can be enhanced in the cross-sectional shape of the second aperture portion MH2. In contrast, if the first aperture portion MH1 is not filled with the rear protective film PMR and if the first and second aperture portions MH1 and MH2 are connected in this state to penetrate the metal foil 10M, the etchant may leak through the connected portion between the first and second aperture portions MH1 and MH2 toward the rear surface 10MR of the metal foil 10M. Consequently, accuracy may be lowered in the shapes of the first and second aperture portions MH1 and MH2.

After forming the first and second aperture portions MH1 and MH2, the front mask RMF is removed from the front surface 10MF and the rear protective film PMR is removed from the rear surface 10MR. Furthermore, after removal of the front mask RMF and the rear protective film PMR from the metal foil 10M, an antireflective film is formed covering the front surface 10MF, the rear surface 10MR, and the side surface defining the first and second aperture portions MH1 and MH2. As described above, the antireflective film has a reflectance lower than that of the metal foil 10M and absorbs part of the light incident on the antireflective film.

For example, the antireflective film may be a coating with a black color. The antireflective film may be formed on the metal foil 10M using a film formation method such as sputtering or vapor deposition. Alternatively, the antireflective film may be formed on the metal foil 10M by having the metal foil 10M contact a liquid for forming an antireflective film.

Through such a method of producing the light shielding plate 10, there is produced a light shielding plate 10 in which one aperture 10H is formed and the ratio of the distance between the front surface 10F and the edge of the central opening HC to the distance between the rear surface 10R and the edge of the central opening HC is 2.5 or more in the thickness direction of the light shielding plate 10.

In the method of producing the light shielding plate 10 described above, the rear mask RMR does not have to be removed prior to forming the rear protective film PMR. In this case, a rear protective film PMR may be formed covering the rear mask RMR and filling the first aperture portion MH1. The rear protective film PMR may be removed from the rear surface 10MR together with the rear mask RMR after forming the second aperture portion MH2 by etching the front surface 10MF.

EXAMPLES

Examples and comparative examples will be described.

Example 1-1

A stainless steel foil having a thickness of 30 μm was used. The rear surface of the stainless steel foil was etched to form a first aperture portion, followed by etching the front surface to form a second aperture portion. Thus, a light shielding plate was obtained which included an aperture having a first aperture portion and a second aperture portion and had an elliptic central opening with a major axis diameter of 270 μm and a minor axis diameter of 75 μm.

Example 1-2

A light shielding plate of Example 1-2 was obtained as in Example 1-1 except that the central opening was changed to have a circular shape with a diameter of 850 μm.

Example 1-3

A light shielding plate of Example 1-3 was obtained as in Example 1-1 except that the central opening was changed to have a circular shape with a diameter of 490 μm.

Example 1-4

A light shielding plate of Example 1-4 was obtained as in Example 1-1 except that the central opening was changed to have a circular shape with a diameter of 6,600 μm.

Example 1-5

A light shielding plate of Example 1-5 was obtained as in Example 1-1 except that the central opening was changed to have a circular shape with a diameter of 2,510 μm.

Example 1-6

A light shielding plate of Example 1-6 was obtained as in Example 1-3 except that the stainless steel foil was changed to have a thickness of 25 μm.

Comparative Example 1-1

A light shielding plate of Comparative Example 1-2 was obtained as in Example 1-1 except that a stainless steel foil of Example 1-2 was punched with a die to form a circular aperture penetrating the stainless steel foil. It should be noted that, in the light shielding plate of Comparative Example 1-1, the diameter of the front opening was equal to the diameter of the rear opening, and these diameters were equal to the second diameter of Example 1-1.

Evaluations

The profile of the second aperture portion in a direction perpendicular to the front surface was measured for light shielding plates of Examples 1-1 to 1-6 and Comparative Example 1-1 using a confocal laser microscope (VK-X1000 Series manufactured by Keyence Corporation). Furthermore, the profile of the first aperture portion in a direction perpendicular to the rear surface was measured for these light shielding plates using a confocal laser microscope (the same as above). Then, the ratio of the second length $D12$ to the first length $D11$ ($D12/D11$) was calculated based on the profiles of the first and second aperture portions. The ratio of the second length $D12$ to the first length $D11$ was as shown in the following Table 1. Table 1 does not include the ratio of the second length $D12$ to the first length $D11$ of Comparative Example 1 because, as mentioned above, the light shielding plate of Comparative Example 1-1 did not have an aperture having a first aperture portion and a second aperture portion.

TABLE 1

|  | D2/D1 |
|---|---|
| Example 1-1 | 3.84 |
| Example 1-2 | 3.35 |
| Example 1-3 | 2.61 |
| Example 1-4 | 2.90 |
| Example 1-5 | 2.57 |
| Example 1-6 | 84.65 |

As shown in Table 1, the ratio of the second length $D12$ to the first length $D11$ was 3.84 in Example 1-1, 3.35 in Example 1-2, and 2.61 in Example 1-3. Furthermore, the ratio of the second length $D12$ to the first length $D11$ was 2.90 in Example 1-4, 2.57 in Example 1-5, and 84.65 in Example 1-6. Thus, the ratio of the second length $D12$ to the first length $D11$ was 2.5 or more in all of the examples.

Also, in the image of each light shielding plate, the side surface of the second aperture portion was equally divided into five regions in the radial direction of the front opening, based on the profile of the second aperture portion to calculate an inclination angle of each region. The calculation results were as shown in Tables 2 and 3. In Tables 2 and 3, the horizontal width refers to the length of each region in the radial direction of the front opening. Also, in Tables 2 and 3, the height difference refers to the difference in height between one end position and the other end position in each region.

TABLE 2

|  | Example 1-1 | | | Example 1-2 | | | Example 1-3 | | |
|---|---|---|---|---|---|---|---|---|---|
|  | Hor. Width (μm) | Height diff. (μm) | Incl. angle (°) | Hor. Width (μm) | Height diff. (μm) | Incl. angle (°) | Hor. Width (μm) | Height diff. (μm) | Incl. angle (°) |
| 1st reg. | 6.5 | 10.7 | 58.7 | 9.5 | 11.4 | 50.2 | 8.1 | 11.0 | 53.6 |
| 2nd reg. | 6.7 | 4.9 | 36.2 | 9.5 | 4.3 | 24.6 | 8.1 | 4.0 | 26.5 |
| 3rd reg. | 6.5 | 3.0 | 24.8 | 9.6 | 2.8 | 16.0 | 8.1 | 2.5 | 17.2 |

TABLE 2-continued

|  | Example 1-1 | | | Example 1-2 | | | Example 1-3 | | |
| --- | --- | --- | --- | --- | --- | --- | --- | --- | --- |
|  | Hor. Width (μm) | Height diff. (μm) | Incl. angle (°) | Hor. Width (μm) | Height diff. (μm) | Incl. angle (°) | Hor. Width (μm) | Height diff. (μm) | Incl. angle (°) |
| $4^{th}$ reg. | 6.7 | 2.6 | 21.3 | 9.6 | 1.9 | 10.9 | 8.1 | 1.9 | 13.3 |
| $5^{th}$ reg. | 6.7 | 2.6 | 21.4 | 9.5 | 2.7 | 15.8 | 8.1 | 2.3 | 15.8 |

TABLE 3

|  | Example 1-4 | | | Example 1-5 | | | Example 1-6 | | |
| --- | --- | --- | --- | --- | --- | --- | --- | --- | --- |
|  | Hor. Width (μm) | Height diff. (μm) | Incl. angle (°) | Hor. Width (μm)) | Height diff. (μm) | Incl. angle (°) | Hor. Width (μm) | Height diff. (μm) | Incl. angle (°) |
| $1^{st}$ reg. | 7.2 | 10.9 | 56.8 | 6.9 | 10.3 | 562. | 7.7 | 11.0 | 54.7 |
| $2^{nd}$ reg. | 7.2 | 4.1 | 29.9 | 7.1 | 4.1 | 30.2 | 7.7 | 4.6 | 31.0 |
| $3^{rd}$ reg. | 7.2 | 2.8 | 21.4 | 6.9 | 2.4 | 19.0 | 7.6 | 2.9 | 21.0 |
| $4^{th}$ reg. | 7.2 | 2.0 | 15.6 | 7.1 | 2.0 | 16.2 | 7.7 | 2.3 | 16.5 |
| $5^{th}$ reg. | 7.2 | 2.5 | 19.2 | 7.1 | 2.8 | 21.5 | 7.7 | 2.4 | 17.5 |

As shown in Tables 2 and 3, in Example 1-1, the side surface defining the second aperture portion was substantially equally divided into five regions in the radial direction of the front opening with the horizontal width of each region set to 6.5 μm or 6.7 μm. In Example 1-2, the side surface defining the second aperture portion was substantially equally divided into five regions in the radial direction of the front opening with the horizontal width of each region set to 9.5 μm or 9.6 μm. In Example 1-3, the side surface defining the second aperture portion was equally divided into five regions in the radial direction of the front opening with the horizontal width of each region set to 8.1 and in Example 1-4, with the horizontal width of each region set to 7.2 In Example 1-5, the side surface defining the second aperture portion was substantially equally divided into five regions in the radial direction of the front opening with the horizontal width of each region set to 6.9 μm or 7.1 μm. In Example 1-6, the side surface defining the second aperture portion was substantially equally divided into five regions in the radial direction of the front opening with the horizontal width of each region set to 7.7 μm or 7.6 μm.

As shown in Tables 2 and 3, in all of Examples 1-1 to 1-6, the first inclination angle θ11 of the first region was the largest of the first to fifth regions, and was 50° or more and 60° or less. Furthermore, in all of Examples 1-1 to 1-6, the inclination angles sequentially became smaller from the first to fourth inclination angles θ11 to θ14, and the fifth inclination angle θ15 was larger than the fourth inclination angle θ14.

The light shielding plates were installed in respective camera units and images of the same object were captured under the same environment. The images captured by using the camera units including the light shielding plates of Examples 1-1 to 1-6 substantially showed no ghosting or flare. Thus, when the ratio of the second length D12 to the first length D11 (D12/D11) was 2.5 or more, ghosting and flare were reduced or prevented. In particular, Example 1-6 could reduce or prevent ghosting and flare more than in Examples 1-1 to 1-5. This is considered to be because Example 1-6, in which the area of the side surface defining the first aperture portion was much smaller than in Examples 1-1 to 1-5, could significantly prevent part of the light incident on the lens from being reflected from the surface of the lens and entering the first aperture portion and being further reflected from the first aperture portion toward the lens. In contrast, the images captured by the camera unit including the light shielding plate of Comparative Example 1-1 showed ghosting and flare.

As described above, according to the first embodiment of the light shielding plate, camera unit, and electronic device, the advantageous effects described below can be achieved.

(1-1) In the light shielding plate 10, since the second aperture portion 10H2 has a shape that is tapered from the front surface 10F toward the rear surface 10R, the light entering the aperture 10H from obliquely above the front surface 10F can be easily reflected by the side surface defining the first aperture portion 10H1 toward the front surface 10F of the light shielding plate 10.

(1-2) Since the ratio of the second length D12 between the front surface 10F and the central opening HC to the first length D11 between the rear surface 10R and the central opening HC (D12/D11) is 2.5 or more, the size of the second aperture portion 10H2 can be maintained so that the shape thereof can be tapered from the front surface 10F toward the rear surface 10R. Thus, the amount of light reflected by the side surface that defines the aperture 10H for light to pass therethrough can be reduced.

(1-3) If the first inclination angle θ11 of the first region R1 is larger than the inclination angles of the second to fifth regions R2 to R5, light can be more easily reflected by the regions other than the first region R1 toward the front surface 10F of the light shielding plate 10, while the diameter of the second aperture portion 10H2 can be prevented from becoming excessively large.

(1-4) If the first inclination angle θ11 is 50° or more and 60° or less, reliability can be enhanced more in reflecting light in the first region R1 including the front opening H2F toward the front surface 10F of the light shielding plate 10, in the side surface defining the second aperture portion 10H2.

(1-5) If the fifth inclination angle θ15 of the fifth region R5 is larger than the fourth inclination angle θ14 of the fourth region R4, the diameter of the second aperture portion 10H2 can be prevented from increasing compared to the case where the fifth inclination angle θ15 of the fifth region R5 is smaller than the fourth inclination angle θ14 of the fourth region R4.

(1-6) If the inclination angles decrease from the first region R1 toward the fourth region R4, light that is incident on the second aperture portion 10H2 can be easily reflected thereon as the central opening HC becomes closer toward the front surface 10F of the light shielding plate 10.

(1-7) If the side surface defining the second aperture portion 10H2 has an arc shape with the center of curvature located outside the light shielding plate 10, specular light having the highest brightness in the reflected light can be reflected from the arc-shaped side surface in a direction toward the front surface 10F of the light shielding plate 10.

(1-8) If the side surface defining the first aperture portion 10H1 has an arc shape with the center of curvature located outside the light shielding plate 10, the amount of light reflected by the side surface defining the aperture 10H can be reduced in the vicinity of the rear opening H1R, of the light entering the aperture from obliquely above the front surface 10F.

The first embodiment described above can be modified and implemented as follows.

[First Aperture Portion]

The side surface defining the first aperture portion 10H1 may have a linear profile in a cross section that is parallel to a plane perpendicular to the front surface 10F. In this case as well, advantageous effects similar to the above (1-1) can be achieved if the first aperture portion 10H1 has a shape tapered from the rear surface 10R toward the front surface 10F, the second aperture portion 10H2 has a shape tapered from the front surface 10F toward the rear surface 10R, and the ratio of the second length D12 to the first length D11 is 2.5 or more.

[Second Aperture Portion]

The side surface defining the second aperture portion 10H2 may have a linear profile in a cross section that is parallel to a plane perpendicular to the front surface 10F. In this case as well, advantageous effects similar to the above (1-1) can be achieved if the first aperture portion 10H1 has a shape tapered from the rear surface 10R toward the front surface 10F, the second aperture portion 10H2 has a shape tapered from the front surface 10F toward the rear surface 10R, and the ratio of the second length D12 to the first length D11 is 2.5 or more.

[Side Surface Defining Second Aperture Portion]

The inclination angles may be sequentially reduced from the first region R1 toward the fifth region R5. In this case as well, advantageous effects similar to the above (1-1) can be achieved if the ratio of the second length D12 to the first length D11 is 2.5 or more.

The inclination angles do not have to be sequentially reduced from the first region R1 toward the fourth region R4. For example, in the first to fourth regions R1 to R4, the inclination angle in each region may be equal to that of another region. In this case as well, advantageous effects similar to the above (1-1) can be achieved if the ratio of the second length D12 to the first length D11 is 2.5 or more.

The fifth inclination angle θ15 of the fifth region R5 may be smaller than the fourth inclination angle θ14 of the fourth region R4. In this case as well, advantageous effects similar to the above (1-1) can be achieved if the ratio of the second length D12 to the first length D11 is 2.5 or more.

The first inclination angle θ11 of the first region R1 may be smaller than 50° or may be larger than 60°. In this case as well, advantageous effects similar to the above (1-1) can be achieved if the ratio of the second length D12 to the first length D11 is 2.5 or more.

The first inclination angle θ11 of the first region R1 may be smaller than the inclination angle of at least one region in the second to fifth regions R2 to R5. In this case as well, advantageous effects similar to the above (1-1) can be achieved if the ratio of the second length D12 to the first length D11 is 2.5 or more.

[Light Shielding Plate]

As mentioned above, the light shielding plate 10 may be formed of metal other than stainless steel. For example, the light shielding plate 10 may be formed of an iron-nickel alloy or may be formed of an iron-nickel-cobalt alloy.

Iron-nickel alloys have thermal expansion coefficients smaller than that of stainless steel. Therefore, light shielding plates formed of an iron-nickel alloy suffer from only small deformation due to changes in outside temperature, and accordingly, can minimize variation in the amount of incident external light due to warpage occurring therein or due to changes in inner diameter that is due to thermal expansion or contraction, which would otherwise have been caused by changes in outside temperature. It should be noted that the amount of incident external light refers to an amount of external light incident on the lens via the light shielding plate 10. Therefore, forming the light shielding plate 10 with an iron-nickel alloy is advantageous for reducing or preventing ghosting and flare that would be caused by variation in the amount of incident external light.

It should be noted that the iron-nickel alloy refers to an alloy containing iron and nickel as main components, e.g., containing 30 mass % or more nickel, and iron as the remainder. Of iron-nickel alloys, an alloy containing 36 mass % nickel, i.e., Invar, is preferred as a material for forming the light shielding plate 10. In Invar, the remainder except for the 36 mass % nickel may contain additives other than iron as a main component. These other additives may be, for example, chromium, manganese, carbon and cobalt. The maximum amount of these other additives contained in the iron-nickel alloy is 1 mass % or less.

Iron-nickel-cobalt alloys have thermal expansion coefficients smaller than those of iron-nickel alloys. Therefore, light shielding plates formed of an iron-nickel-cobalt alloy suffer from only small deformation due to changes in outside temperature, and accordingly, can further minimize variation in the amount of incident external light due to warpage occurring therein or due to changes in inner diameter that is due to thermal expansion or contraction, which would otherwise have been caused by changes in outside temperature. Therefore, forming the light shielding plate 10 with an iron-nickel-cobalt alloy is more advantageous for reducing or preventing ghosting and flare that would be caused by changes in the amount of incident external light.

It should be noted that the iron-nickel-cobalt alloy refers to an alloy containing iron, nickel and cobalt as main components, e.g., containing 30 mass % or more nickel, 3 mass % or more cobalt, and iron as the remainder. Of the iron-nickel-cobalt alloys, an alloy containing 32 mass % nickel and 4 mass % or more and 5 mass % or less cobalt, i.e., Super Invar, is preferred as a material for forming the light shielding plate 10. In Super Invar, the remainder except for the 32 mass % nickel and 4 mass % or more and 5 mass % or less cobalt may contain additives other than iron as a main component. The additives may be, for example, chromium, manganese and carbon. The maximum amount of additives contained in the iron-nickel-cobalt alloy may be 0.5 mass % or less.

Thus, if the light shielding plate 10 is made of an iron-nickel alloy or an iron-nickel-cobalt alloy, the following advantageous effects can be achieved.

(1-9) Deformation of the light shielding plate 10 due to changes in outside temperature can be reduced or prevented, and this can reduce or prevent variation in the amount of incident external light due to changes in outside temperature. Consequently, ghosting or flare can be prevented from being produced, which would otherwise have been caused by variation in the amount of incident external light.

Second Embodiment

Figure 10:
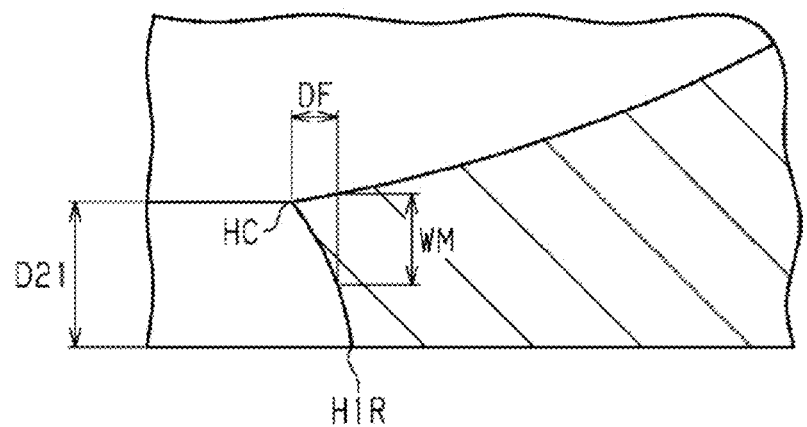
FIG. 10 is a partial enlarged cross-sectional view illustrating a part of a cross section of a light shielding plate according to a second embodiment.
Figure 11:
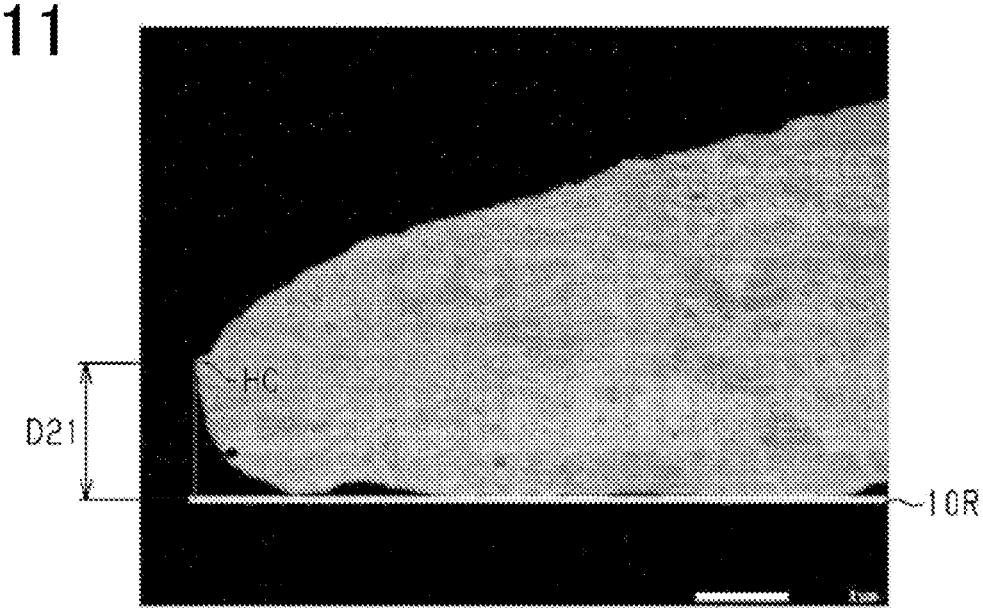
FIG. 11 is an image of a cross-sectional structure of a light shielding plate according to Example 2-1.

Referring to FIGS. 10 and 11, a second embodiment for a light shielding plate, a camera unit, and an electronic device will be described. The second embodiment is different from the first embodiment in the configuration of the light shielding plate. Accordingly, the differences will be described in detail below, and description other than the differences will be omitted. Hereinafter, the light shielding plate and examples will be sequentially described.

[Light Shielding Plate]

Referring to FIG. 10, the light shielding plate will be described.

FIG. 10 shows an enlargement of part of the cross-sectional structure of the light shielding plate 10 shown in FIG. 2.

When an image of the edge of the central opening HC is captured in the radial direction thereof by bringing the edge into focus under imaging conditions where the depth of field is 0.4 µm, as shown in FIG. 10, the maximum length of the light shielding plate 10 that can be in focus in the thickness direction thereof is referred to as a maximum focusable length WM. Specifically, the maximum focusable length WM is a thickness of the light shielding plate 10 at a position away from the edge of the central opening HC by a distance corresponding to a depth of field DF in the direction perpendicular to the thickness direction of the light shielding plate 10.

The maximum focusable length WM is 7.0 µm or less. Also, the maximum focusable length WM is 30% or less the thickness T of the light shielding plate 10. The maximum focusable length WM may be 3.0 µm or less. Also, the maximum focusable length WM may be 1.0 µm or more. The maximum focusable length WM may only satisfy either the condition of 7.0 µm or less or the condition of 30% or less the thickness T of the light shielding plate 10, and it does not necessarily have to satisfy both.

In the thickness direction of the light shielding plate 10, the distance between the rear surface 10R and the edge of the central opening HC is an aperture length D21. The aperture length D21 may be more than 0 µm and 3 µm or less. Alternatively, the aperture length D21 may be 30% or less the thickness of the light shielding plate 10. The aperture length D21 may satisfy the condition of 30% or less the thickness of the light shielding plate 10, and it does not necessarily have to satisfy the condition of 3 µm or less. The aperture length D21 may be smaller than the maximum focusable length WM or may be substantially equal to the maximum focusable length WM.

The light incident on the light shielding plate 10 in the direction perpendicular to the front surface 10F enters the aperture 10H from the front opening H2F formed in the front surface 10F. The light that has passed through the aperture 10H is outputted from the rear opening H1R formed in the rear surface 10R and reaches the lens LN. In the light shielding plate 10, since the second aperture portion 10H2 has a shape that is tapered from the front surface 10F toward the rear surface 10R, the light entering the aperture 10H from obliquely above the front surface 10F is likely to be reflected by the side surface defining the second aperture portion 10H2 toward the front surface 10F of the light shielding plate 10.

Furthermore, since the maximum focusable length WM is 7.0 µm or less or 30% or less the thickness T of the light shielding plate 10, the area of the side surface defining the aperture 10H can be reduced in the vicinity of the central opening HC, and resultantly the amount of light reflected by the side surface defining the aperture 10H can be reduced in the vicinity of the central opening HC. Consequently, the amount of light reflected by the side surface that defines the aperture 10H for light to pass therethrough can be reduced. If the maximum focusable length WM is 3.0 µm or less, the area of the side surface defining the aperture can be further reduced in the vicinity of the central opening HC, and resultantly the amount of light reflected by the side surface defining the aperture 10H can be further reduced in the vicinity of the central opening HC.

Also, if the maximum focusable length WM is 1.0 µm or more, the portion of the light shielding plate 10 including the central opening HC will have a thickness of 1.0 µm or more and thus deformation in the vicinity of the central opening HC can be minimized. Accordingly, the amount of light passing through the light shielding plate 10 via the central hole HC is prevented from being varied due to deformation of the light shielding plate 10.

Furthermore, if the aperture length D21 is more than 0 µm and 3 µm or less or 30% or less the thickness of the light shielding plate 10, the area of the side surface defining the first aperture portion 10H1 can be reduced, so that the amount of light reflected by the side surface defining the first aperture portion 10H1 can be reduced. Consequently, the amount of light reflected by the side surface that defines the aperture 10H for light to pass therethrough can be reduced.

EXAMPLES

Referring to FIG. 11, examples and comparative examples will be described.

Example 2-1

A stainless steel foil having a thickness of 25 µm was used. The rear surface of the stainless steel foil was etched to form a first aperture portion, followed by etching the front surface to form a second aperture portion. Thus, a light shielding plate having an aperture defined by the first aperture portion and the second aperture portion was obtained.

Example 2-2

A light shielding plate of Example 2-2 was obtained as in Example 2-1 except that the second diameter of the front opening of the second aperture portion was increased.

Example 2-3

A light shielding plate of Example 2-3 was obtained as in Example 2-2 except that the second diameter of the front opening of the second aperture portion was decreased.

Comparative Example 2-1

A light shielding plate of Comparative Example 2-1 was obtained as in Example 2-1 except that the stainless steel foil was punched with a die to form a circular aperture penetrating the stainless steel foil. It should be noted that, in the light shielding plate of Comparative Example 1, the diameter of the front opening was equal to the diameter of the rear opening, and these diameters were equal to the second diameter of Example 2-1.

Evaluations

The maximum focusable length WM of the light shielding plates of Examples 2-1 to 2-3 and Comparative Example 2-1 was measured using a confocal laser microscope (VK-X1000 Series manufactured by Keyence Corporation). In this case, an objective lens with 50-fold magnification was mounted to the confocal laser microscope. A maximum focusable length WM was measured by observing the side surface defining the aperture in the direction perpendicular to the side surface and bringing the edge of the central opening into focus using the confocal laser microscope. In confocal laser microscopes, the focus range, i.e., the depth of field, depends on the magnification of the objective lens used. Since an object can be in focus in the field of depth, the maximum focusable length of the light shielding plate in the thickness direction thereof depends on the position from the edge of the central opening. Accordingly, practically, the light shielding plate has a predetermined focusable length at a focus matching position. Objective lenses with 50-fold magnification have a field of depth of 0.4 µm. Therefore, the maximum focusable length was defined to be a maximum length of the light shielding plate in the thickness direction thereof in a state where the edge of the central opening was in focus with the field of depth being 0.4 µm. In other words, the thickness of the light shielding plate at a position away from the edge of the central opening by the field of depth is the maximum focusable length WM of the light shielding plate. Measurements of the maximum focusable length WM were as shown in Table 4.

The light shielding plates of Examples 2-1 to 2-3 and Comparative Example 2-1 were cut parallel to a plane perpendicular to the front surface to prepare measurement targets. Of these measurement targets, the image of the measurement target of Example 2-1 was as shown in FIG. 11. The aperture length if Examples 2-1 to 2-3 and Comparative Example 2-1 was measured. The measurements were as shown in Table 4. Since the aperture of the light shielding plate of Comparative Example 2-1 had none of the first aperture portion, second aperture portion and central opening, there is no indication of maximum focusable length and aperture length.

TABLE 4

| | Max. focusable length WM (µm) | Aperture length (µm) | Ghosting/Flare |
|---|---|---|---|
| Example 2-1 | 2.3 | 0.27 | Excellent |
| Example 2-2 | 0.6 | 0.10 | Good |
| Example 2-3 | 6.96 | 7.05 | Fair |
| Comp. Example 2-1 | — | — | Poor |

As shown in Table 4, the maximum focusable length WM of Example 2-1 was 2.3 µm, that of Example 2-2 was 0.6 µm, and that of Example 2-3 was 6.96 µm. Thus, in all of Examples 2-1 to 2-3, the maximum focusable length WM was 7.0 µm or less. As shown in Table 4, the aperture length D21 of Example 2-1 was 0.27 µm, that of Example 2-2 was 0.10 µm, and that of Example 2-3 was 7.05 µm.

As shown in FIG. 11, the first aperture portion of the light shielding plate of Example 2-1 had a rear opening H1R and a central opening HC. The light shielding plates of Examples 2-2 and 2-3 also had apertures in a shape similar to that of the aperture of the light shielding plate of Example 2-1.

Prior to forming measurement targets from the respective light shielding plates, the light shielding plates were mounted to respective camera units and images of the same object were captured under the same environment. The images captured by the camera units were evaluated according to the following criteria.

Excellent: Neither ghosting nor flare occurred.
Good: No ghosting occurred but flare not greatly reducing image contrast occurred.
Fair: Ghosting occurred only in part of the image, and flare not greatly reducing image contrast occurred.
Poor: Ghosting occurred over a wide range of the image and flare greatly reducing image contrast occurred.

As shown in Table 4, the images captured using the light shielding plate of Example 2-1 were evaluated to be excellent, the images captured using the light shielding plate of Example 2-2 were evaluated to be good, and the images captured using the light shielding plate of Example 2-3 were evaluated to be fair. Also, as shown in Table 4, the images captured using the light shielding plate of Comparative Example 2-1 were evaluated to be poor.

Thus, Examples 2-1 to 2-3 could reduce ghosting and flare compared to Comparative Example 2-1. Accordingly, it can be said that Examples 2-1 to 2-3 can reduce the amount of light reflected by the side surface that defines the aperture of the light shielding plate for light to pass therethrough. Example 2-3 can reduce the amount of light reflected by the side surface that defines the aperture of the light shielding plate for light to pass therethrough compared to Comparative Example 2-1, but causes ghosting and flare. Therefore, it can be said that the maximum focusable length WM is preferred to be 7.0 µm or less. Also, it is considered that Example 2-2 can reduce the amount of light reflected by the side surface that defines the aperture of the light shielding plate for light to pass therethrough compared to Comparative Example 2-1; however, when compared to Example 2-1, Example 2-2 reflects larger amount of light at the side surface that defines the aperture of the light shielding plate for light to pass therethrough. Such a difference in the amount of light is considered to be due to deformation of the light shielding plate which occurs due to lowering of the strength therein. Therefore, the maximum focusable length WM may preferably be 1.0 µm or more to minimize deformation of the light shielding plate.

As described above, according to the second embodiment of the light shielding plate, camera unit, and electronic device, the advantageous effects described below can be achieved.

(2-1) With the maximum focusable length WM being 7.0 µm or less, the area of the side surface defining the aperture 10H can be reduced in the vicinity of the central opening HC, and resultantly the amount of light reflected by the side surface defining the aperture 10H can be reduced in the vicinity of the central opening HC. Consequently, the amount of light reflected by the side surface that defines the aperture 10H for light to pass therethrough can be reduced.

(2-2) With the maximum focusable length WM being 3.0 µm or less, the amount of light reflected by the side surface defining the aperture 10H can be further reduced in the vicinity of the central opening HC. Consequently, the amount of light reflected by the side surface that defines the aperture 10H for light to pass therethrough can be further reduced.

(2-3) With the maximum focusable length WM being 1.0 µm or more, deformation can be reduced or prevented in the vicinity of the central opening HC. Accordingly, the amount of light passing through the light shielding plate 10 via the central hole HC is prevented from being varied due to deformation of the light shielding plate 10.

(2-4) With the aperture length D21 being 3.0 µm or less, the area of the side surface defining the first aperture portion 10H1 can be reduced, so that the amount of light reflected by the side surface defining the first aperture portion 10H1 can be reduced. Consequently, the amount of light reflected by the side surface that defines the aperture 10H for light to pass therethrough can be reduced.

(2-5) With the aperture length D21 being 30% or less the thickness of the light shielding plate 10, the area of the side surface defining the first aperture portion 10H1 can be reduced, so that the amount of light reflected by the side surface defining the first aperture portion 10H1 can be reduced. Consequently, the amount of light reflected by the side surface that defines the aperture 10H for light to pass therethrough can be reduced.

(2-6) With the maximum focusable length WM being 30% or less the thickness of the light shielding plate 10, the area of the side surface defining the aperture 10H can be reduced in the vicinity of the central opening HC, so that the amount of light reflected by the side surface defining the aperture 10H can be reduced in the vicinity of the central opening HC. Consequently, the amount of light reflected by the side surface that defines the aperture 10H for light to pass therethrough can be reduced.

The second embodiment described above can be modified and implemented as follows.

[Aperture Length]

The aperture length D21 may be more than 3 µm. In this case as well, advantageous effects similar to the above (2-1) can be achieved if the maximum focusable length WM is 7.0 µm or less. Also, in this case as well, advantageous effects similar to the above (2-6) can be achieved if the maximum focusable length WM is 30% or less the thickness of the light shielding plate 10.

The aperture length D21 may be more than 30% the thickness of the light shielding plate 10. In this case as well, advantageous effects similar to the above (2-1) can be achieved if the maximum focusable length WM is 7.0 µm or less. Also, in this case as well, advantageous effects similar to the above (2-6) can be achieved if the maximum focusable length WM is 30% or less the thickness of the light shielding plate 10.

[Maximum Focusable Length]

The maximum focusable length WM may be more than 0 µm and less than 1 µm. In this case as well, advantageous effects similar to the above (2-1) can be achieved if the maximum focusable length WM is 7.0 µm or less. Also, in this case as well, advantageous effects similar to the above (2-6) can be achieved if the maximum focusable length WM is 30% or less the thickness of the light shielding plate 10.

The maximum focusable length WM may be more than 3.0 µm and 7.0 µm or less. In this case as well, advantageous effects similar to the above (2-1) can be obtained.

[First Aperture Portion]

As long as the first aperture portion 10H1 has a shape tapered from the rear surface 10R toward the front surface 10F, the side surface defining the first aperture portion 10H1 may have a linear profile in a cross section that is parallel to a plane perpendicular to the front surface 10F.

[Second Aperture Portion]

As long as the second aperture portion 10H2 has a shape tapered from the front surface 10F toward the rear surface 10R, the side surface defining the second aperture portion 10H2 may have a linear profile in a cross section that is parallel to a plane perpendicular to the front surface 10F.

[Light Shielding Plate]

As mentioned above, the light shielding plate 10 may be formed of metal other than stainless steel. The light shielding plate 10 may be made of any of the metals mentioned in the modifications of the first embodiment.

The light shielding plate 10 of the second embodiment may be implemented being combined with the structure of the light shielding plate 10 of the first embodiment.

Third Embodiment

Figure 12:
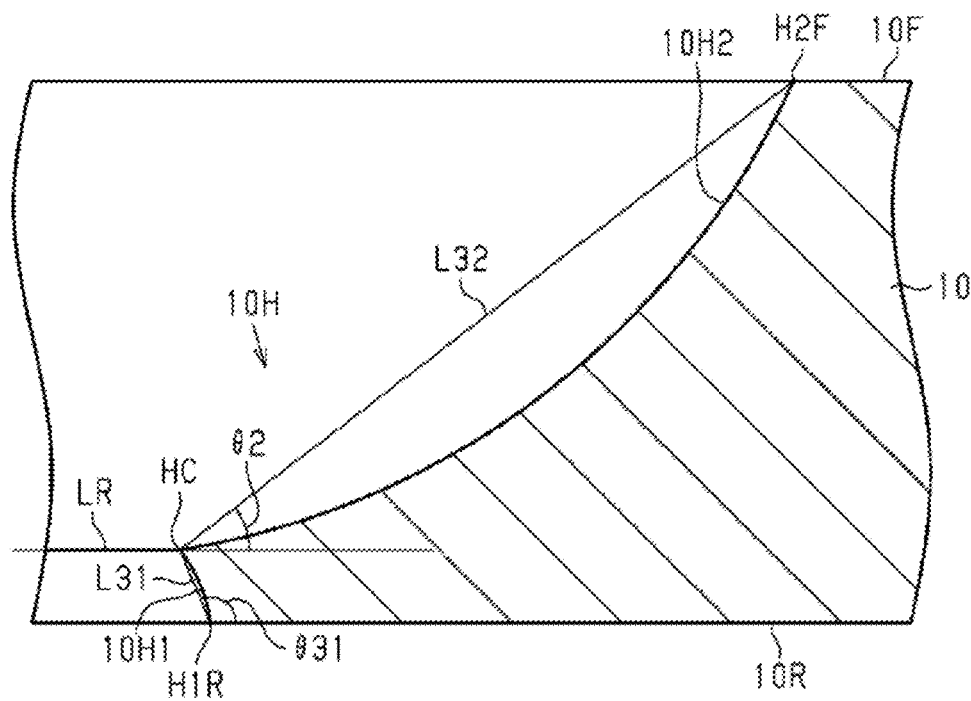
FIG. 12 is a partial enlarged cross-sectional view illustrating a part of a cross section of a light shielding plate according to a third embodiment.
Figure 13:
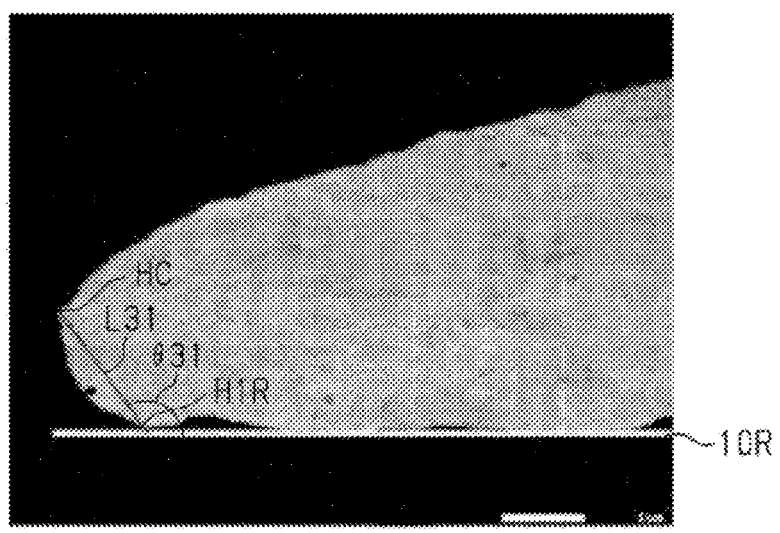
FIG. 13 is an image of a cross-sectional structure of a light shielding plate according to Example 3-1.

Referring to FIGS. 12 and 13, a third embodiment for a light shielding plate, a camera unit, and an electronic device will be described. The third embodiment is different from the first embodiment in the configuration of the light shielding plate. Accordingly, the differences will be described in detail below, and description other than the differences will be omitted. Hereinafter, the light shielding plate and examples will be sequentially described.

[Light Shielding Plate]

Referring to FIG. 12, the light shielding plate will be described.

FIG. 12 shows a partial enlargement of the cross-sectional structure of the light shielding plate 10 shown in FIG. 2.

As shown in FIG. 12, in a cross section that is parallel to a plane perpendicular to the front surface 10F, the line connecting between the edge of the central opening HC and the edge of the rear opening H1R is defined to be a first line L31. The angle between the first line L31 and the rear surface 10R is defined to be a first angle θ31. The first angle θ31 is larger than 90°. It should be noted that the cross section that is parallel to a plane perpendicular to the front surface 10F passes through the center of the front opening H2F. Furthermore, in a cross section that is parallel to a plane perpendicular to the front surface 10F, the first line L31 is a chord of the arc connecting between the central opening HC and the rear opening H1R.

In a cross section that is parallel to a plane perpendicular to the front surface 10F, the line passing through the edge of the central opening HC and parallel to the rear surface 10R is defined to be a reference line LR. Also, the shortest line connecting between the edge of the central opening HC and the edge of the front opening H2F is defined to be a second line L32. The angle between the reference line LR and the second line L32 may be 20° or more and 40° or less.

If the light shielding plate 10 is installed in a camera unit which is mounted to the front surface of a smartphone, tablet type personal computer, or notebook type personal computer, the camera unit may often capture an image of a target at a short distance. Therefore, to cope with increase in the field of view, the angle between the reference line LR and the second line L32 may be any angle in the range of 20° or more and 30° or less. If the light shielding plate 10 is installed in an in-vehicle camera, the camera unit may often capture an image of a target at a medium to long distance. Therefore, to cope with decrease in the field of view, the angle between the reference line LR and the second line L32 is preferred to be included in the range of 30° or more and 40° or less.

Furthermore, if the light shielding plate 10 is installed in a camera unit that is mounted to the rear surface of a smartphone, the camera unit may often capture an image of a target at a short to long distance. Therefore, to cope with the case where the angle of view is increased, the angle between the reference line LR and the second line L32 may be 20° or more and 30° or less, and to cope with the case where the angle of view is decreased, this angle may be 30° or more and 40° or less.

The light incident on the light shielding plate 10 in the direction perpendicular to the front surface 10F enters the aperture 10H from the front opening H2F formed in the front surface 10F. The light that has passed through the aperture 10H is outputted from the rear opening H1R formed in the rear surface 10R and reaches the lens LN. In the light shielding plate 10, since the second aperture portion 10H2 has a shape that is tapered from the front surface 10F toward the rear surface 10R, the light entering the aperture 10H from obliquely above the front surface 10F can be easily reflected by the side surface defining the first aperture portion 10H1 toward the front surface 10F of the light shielding plate 10.

Also, compared to the case where the angle between the first line L31 and the rear surface 10R is 90°, the amount of light reflected by the side surface defining the aperture 10H can be reduced in the vicinity of the rear opening H1R, of the light incident on the light shielding plate 10 from obliquely above the front surface 10F. Thus, the amount of light reflected by the side surface that defines the aperture 10H for light to pass therethrough can be reduced. Consequently, unwanted light is prevented from being incident on the lens LN facing the light shielding plate 10.

Also, the light that is incident on the second aperture portion 10H2 from obliquely above the front surface 10F is reflected by the side surface having an arc shape. Accordingly, specular light having the highest brightness in the reflected light is reflected from the arc-shaped side surface in a direction toward the front surface 10F of the light shielding plate 10. Therefore, the amount of light reflected by the side surface that defines the aperture 10H for light to pass therethrough can be further reduced.

In the light shielding plate 10, the side surface defining the first aperture portion 10H1 has an arc shape with the center of curvature located outside the light shielding plate 10. Therefore, compared to the case where the side surface defining the first aperture portion 10H1 has a linear profile, the amount of light reflected by the side surface defining the aperture 10H can be reduced in the vicinity of the rear opening H1R, of the light entering the aperture from obliquely above the front surface 10F. Thus, the amount of light reflected by the side surface that defines the aperture 10H for light to pass therethrough can be further reduced.

Furthermore, compared to the case where the angle between the second line L32 and the reference line LR is larger than 40°, the light incident on the side surface defining the aperture 10H can be easily reflected toward the front surface 10F of the light shielding plate 10 when light is incident on this portion of the side surface from obliquely above the front surface 10F, and also incident thereon in a direction deviated only a little from the direction perpendicular to the front surface 10F. Therefore, the amount of light reflected by the side surface that defines the aperture 10H for light to pass therethrough can be further reduced.

EXAMPLES

Referring to FIG. 13, examples and comparative examples will be described.

Example 3-1

A stainless steel foil having a thickness of 25 μm was used. The rear surface of the stainless steel foil was etched to form a first aperture portion, followed by etching the front surface to form a second aperture portion. Thus, a light shielding plate having an aperture defined by the first aperture portion and the second aperture portion was obtained. The first aperture portion had a first diameter of 490 μm, while the second aperture portion had a second diameter of 571 μm.

Comparative Example 3-1

A light shielding plate of Comparative Example 3-1 was obtained as in Example 3-1 except that the stainless steel foil was punched with a die to form a circular aperture penetrating the stainless steel foil. It should be noted that, in the light shielding plate of Comparative Example 3-1, the diameter of the front opening was equal to the diameter of the rear opening, and these diameters were equal to the second diameter of Example 3-1.

Comparative Example 3-2

A light shielding plate of Comparative Example 3-2 was obtained as in Example 3-1 except that the stainless steel foil was penetrated by applying a laser beam between the bottom of the second aperture portion and the rear surface after forming the second aperture portion without forming a first aperture portion. It should be noted that, in the light shielding plate of Comparative Example 3-2, the diameter of the front opening was equal to the second diameter of Example 3-1, and the diameter of the rear opening was equal to the first diameter of Example 3-1.

Evaluations

The light shielding plates of Example 3-1 and Comparative Examples 3-1 and 3-2 were cut parallel to a plane perpendicular to the front surface to prepare measurement targets. The measurement target of Example 3-1 was imaged using a scanning electron microscope and the image was as shown in FIG. 13.

As shown in FIG. 13, in the measurement target of Example 3-1, the first angle θ31 between the first line L31 and the rear surface 10R was 125°, i.e., larger than 90°. Also, across the side surface defining the aperture in the measurement target of Comparative Example 3-1, the angle between the side surface and the rear surface was 90°. In the measurement target of Comparative Example 3-2, the angle between the side surface formed by applying a laser beam and the rear surface was 90°.

It should be noted that, prior to forming measurement targets from the respective light shielding plates, the light shielding plates were mounted to respective camera units and images of the same object were captured under the same environment. The images captured using the camera unit including the light shielding plate of Example 3-1 showed no ghosting or flare. In contrast, the images captured using the camera units including the light shielding plates of Comparative Examples 3-1 and 3-2 showed ghosting and/or flare.

As described above, according to the third embodiment of the light shielding plate, camera unit, and electronic device, the advantageous effects described below can be achieved.

(3-1) The amount of light reflected by the side surface defining the aperture 10H can be reduced in the vicinity of the rear opening H1R. Thus, the amount of light reflected by the side surface that defines the aperture 10H for light to pass therethrough can be reduced.

(3-2) The light incident on the second aperture portion 10H2 from obliquely above the front surface 10F is reflected by the side surface having an arc shape. Accordingly, specular light having the highest brightness in the reflected light is reflected from the arc-shaped side surface in a direction toward the front surface 10F of the light shielding plate 10. Therefore, the amount of light reflected by the side surface that defines the aperture 10H for light to pass therethrough can be further reduced.

(3-3) In the light shielding plate 10, the side surface defining the first aperture portion 10H1 has an arc shape with the center of curvature located outside the light shielding plate 10. Therefore, compared to the case where the side surface defining the first aperture portion 10H1 has a linear profile, the amount of light reflected by the side surface defining the aperture 10H can be reduced in the vicinity of the rear opening H1R, of the light entering the aperture from obliquely above the front surface 10F. Thus, the amount of light reflected by the side surface that defines the aperture 10H for light to pass therethrough can be further reduced.

(3-4) Compared to the case where the angle between the second line L32 and the reference line LR is larger than 40°, the light incident on the side surface defining the aperture 10H can be easily reflected toward the front surface 10F of the light shielding plate 10 when light is incident on this portion of the side surface from obliquely above the front surface 10F, and also incident thereon in a direction deviated only a little from the direction perpendicular to the front surface 10F. Therefore, the amount of light reflected by the side surface that defines the aperture 10H for light to pass therethrough can be further reduced.

The third embodiment described above can be modified and implemented as follows.

[Second Angle]

The second angle θ32 between the second line L32 and the reference line LR may be larger than 40°. In this case as well, advantageous effects similar to the above (3-1) can be achieved if the first aperture portion 10H1 has a shape tapered from the rear surface 10R toward the front surface 10F, the second aperture portion 10H2 has a shape tapered from the front surface 10F toward the rear surface 10R, and the first angle θ31 is larger than 90°.

[First Aperture Portion]

The side surface defining the first aperture portion 10H1 may have a linear profile in a cross section that is parallel to a plane perpendicular to the front surface 10F. In this case as well, advantageous effects similar to the above (3-1) can be achieved if the first aperture portion 10H1 has a shape tapered from the rear surface 10R toward the front surface 10F, the second aperture portion 10H2 has a shape tapered from the front surface 10F toward the rear surface 10R, and the first angle θ31 is larger than 90°.

[Second Aperture Portion]

The side surface defining the second aperture portion 10H2 may have a linear profile in a cross section that is parallel to a plane perpendicular to the front surface 10F. In this case as well, advantageous effects similar to the above (3-1) can be achieved if the first aperture portion 10H1 has a shape tapered from the rear surface 10R toward the front surface 10F, the second aperture portion 10H2 has a shape tapered from the front surface 10F toward the rear surface 10R, and the first angle θ31 is larger than 90°.

[Light Shielding Plate]

As mentioned above, the light shielding plate 10 may be formed of metal other than stainless steel. The light shielding plate 10 may be made of any of the metals mentioned in the modifications of the first embodiment.

The light shielding plate 10 of the third embodiment may be implemented being combined with the structure of the light shielding plate 10 of the first embodiment and/or the structure of the light shielding plate 10 of the second embodiment.

What is claimed is:

1. A light shielding plate made of metal, comprising:
a front surface located on a light incident side;
a rear surface facing away from the front surface; and
an aperture penetrating through the front surface and the rear surface, wherein
the aperture includes a first aperture portion and a second aperture portion connected to the first aperture portion via a central opening, the first aperture portion extending from a rear opening in the rear surface toward the central opening and having a shape tapered from the rear surface toward the front surface, the second aperture portion extending from a front opening in the front surface toward the central opening and having a shape tapered from the front surface toward the rear surface, the front opening being larger than the rear opening; and
when an image of an edge of the central opening is captured in a radial direction thereof by bringing the edge into focus under imaging conditions where a depth of field is 0.4 μm, a maximum focusable length of the light shielding plate that can be in focus in a thickness direction thereof is 7.0 μm or less.

2. The light shielding plate of claim 1, wherein the maximum focusable length of the light shielding plate is 3.0 μm or less.

3. The light shielding plate of claim 1, wherein the maximum focusable length of the light shielding plate is 1.0 μm or more.

4. The light shielding plate of claim 1, wherein a distance between the rear surface and the edge of the central opening is more than 0 μm and 3 μm or less in the thickness direction of the light shielding plate.

5. The light shielding of claim 1, wherein a distance between the rear surface and the edge of the central opening is 30% or less the thickness of the light shielding plate in the thickness direction of the light shielding plate.

6. A light shielding plate made of metal, comprising:
a front surface located on a light incident side;
a rear surface facing away from the front surface; and
an aperture penetrating through the front surface and the rear surface, wherein
the aperture includes a first aperture portion and a second aperture portion connected to the first aperture portion via a central opening, the first aperture portion extending from a rear opening in the rear surface toward the central opening and having a shape tapered from the rear surface toward the front surface, the second aperture portion extending from a front opening in the front surface toward the central opening and having a shape tapered from the front surface toward the rear surface, the front opening being larger than the rear opening; and
when an image of an edge of the central opening is captured in a radial direction thereof by bringing the edge into focus under imaging conditions where a depth of field is 0.4 μm, a maximum focusable length of the light shielding plate that can be in focus in a thickness direction thereof is 30% or less the thickness of the light shielding plate in the thickness direction thereof.

7. The light shielding plate of claim 1, wherein the light shielding plate has a thickness of 10 μm or more and 100 μm or less.

8. The light shielding plate of claim 1, wherein the light shielding plate is made of an iron-nickel alloy or an iron-nickel-cobalt alloy.

9. The light shielding plate of claim 8, wherein the light shielding plate is made of Invar or Super Invar.

10. A camera unit including the light shielding plate of claim 1.

11. An electronic device including the camera unit of claim 10.

* * * * *